(12) United States Patent
Martin et al.

(10) Patent No.: US 6,522,174 B2
(45) Date of Patent: Feb. 18, 2003

(54) DIFFERENTIAL CASCODE CURRENT MODE DRIVER

(75) Inventors: Aaron K. Martin, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/835,892

(22) Filed: Apr. 16, 2001

(65) Prior Publication Data

US 2002/0149395 A1 Oct. 17, 2002

(51) Int. Cl.[7] .......................................... H03K 19/094
(52) U.S. Cl. ...................... 326/115; 326/127; 326/30; 327/51; 327/52; 327/53
(58) Field of Search ............... 326/115, 127, 326/30; 327/51, 52, 53, 54, 55, 89

(56) References Cited

U.S. PATENT DOCUMENTS

| | | | | |
|---|---|---|---|---|
| 4,573,168 A | | 2/1986 | Henze et al. ................. | 375/36 |
| 5,253,249 A | | 10/1993 | Fitzgerald et al. ............ | 370/24 |
| 5,457,406 A | | 10/1995 | Takada et al. ................ | 326/30 |
| 5,490,171 A | | 2/1996 | Epley et al. ................ | 375/257 |
| 5,604,464 A | * | 2/1997 | Hwang et al. ............... | 330/253 |
| 5,648,734 A | * | 7/1997 | Tanabe et al. ............... | 326/115 |
| 5,703,519 A | * | 12/1997 | Crook et al. ................. | 326/115 |
| 5,778,204 A | * | 7/1998 | Van Brunt et al. .......... | 710/305 |
| 5,977,800 A | * | 11/1999 | Iravani ........................ | 326/115 |
| 6,107,856 A | * | 8/2000 | Bitting ........................ | 327/307 |
| 6,226,331 B1 | * | 5/2001 | Gambuzza ................... | 375/220 |
| 6,256,234 B1 | * | 7/2001 | Keeth et al. ................. | 327/161 |

OTHER PUBLICATIONS

Farjad–Rad, R., et al., "A 0.4–um CMOS 10–Gb/s 4–PAM Pre–Emphasis Serial Link Transmitter", *IEEE Journal of Solid–State Circuits, 34*(5), pp. 580–585, (May 1999).

* cited by examiner

*Primary Examiner*—Michael G. Lee
*Assistant Examiner*—Steven S. Paik
(74) *Attorney, Agent, or Firm*—Schwegman, Lundberg, Woessner & Kluth, P.A.

(57) ABSTRACT

A current mode driver includes a tail current device, a differential pair of input transistors, cascode output transistors, and pre-charge circuits to charge cascode nodes between the differential pair of input transistors and the cascode output transistors. The current mode driver is driven by CMOS drivers that alternately turn the input transistors on and off. A wide-swing bias circuit provides bias voltages for the current mode driver. This bias voltage for the tail current device is closely matched to provide current matching between the bias circuit and the current mode driver.

18 Claims, 5 Drawing Sheets

DIFFERENTIAL CASCODE CURRENT MODE DRIVER

FIELD

The present invention relates generally to current mode drivers, and more specifically to scalable, low power, current mode drivers.

BACKGROUND

Integrated circuits typically have dedicated interface circuits to communicate with other integrated circuits and other systems. Some dedicated interface circuits employ current mode drivers that drive currents between integrated circuits. Typical current mode drivers include input transistors that do not completely turn off. Known methods for biasing these drivers includes the use of wide-swing bias circuits. Examples of wide-swing bias circuits are discussed in chapter six of: David A Johns & Ken Martin, "Analog Integrated Circuit Design," (1997).

Signals that travel from one integrated circuit to another are becoming faster and faster. As signal speeds increase, the effect of imperfect "channels" also increases. A "channel," for the purposes of this description, is any medium that the signal passes through. For example, a channel may consist of printed circuit board traces or wires routed between integrated circuits. One possible effect of an imperfect channel is frequency dependent attenuation of signal amplitudes. In general, when the signal amplitude is attenuated as a function of frequency, the signal becomes smaller as the speed increases. When the signal gets too small, communications between integrated circuits can become unreliable.

One known method for compensating for frequency dependent attenuation is the use of pre-equalization at the driver. Pre-equalization adjusts the amplitude of the driver depending on the frequency of outbound data. Successful pre-equalization compensates for signal loss in the channel, and results in a substantially constant amplitude received voltage wave for low and high frequency data. One mechanism for pre-equalization is described in: Ramin Faijad-Rad, Chih-Kong Ken Yang, Mark A. Horowitz, and Thomas H. Lee, "A 0.4-um CMOS 10-Gb/s 4-PAM Pre-Emphasis Serial Link Transmitter," Vol. 34, No. 5, IEEE Journal of Solid-State Circuits, (May 1999).

For the reasons stated above, and for other reasons stated below which will become apparent to those skilled in the art upon reading and understanding the present specification, there is a need in the art for alternate integrated circuit interfaces.

DESCRIPTION OF EMBODIMENTS

Figure 1:
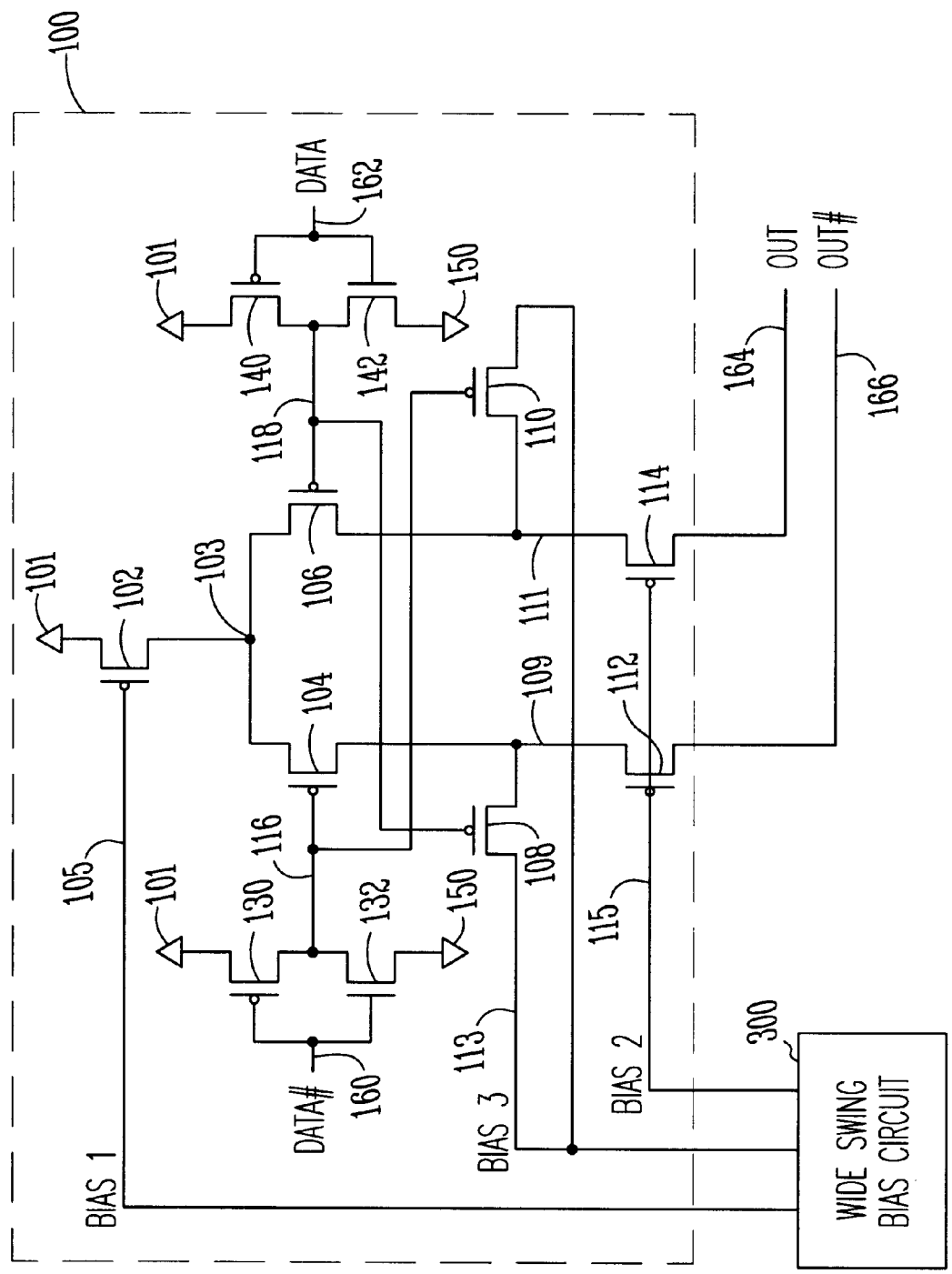
FIG. 1 shows a differential cascode current mode driver with a wide-swing bias circuit.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

FIG. 1 shows a differential cascode current mode driver with a wide-swing bias circuit. Current driver 100 has a pair of differential input nodes 160 and 162, and a pair of differential output nodes 164 and 166. In operation, a digital signal and its logical complement, "DATA" and "DATA#," are provided on differential input nodes 162 and 160, respectively. In response to the digital input signal, a current appears on one of the two differential output nodes 164 and 166. For example, when the DATA signal is high, and the DATA# signal is low, a current signal "OUT" appears on node 164, and no current appears on node 166. When the input signals on differential input nodes 160 and 162 are in the opposite state, no current appears on node 164, and a current signal "OUT#" appears on node 166.

Current mode driver 100 includes transistors 102, 104, 106, 108, 110, 112, and 114. Transistor 102 is a "tail current" device that sources current from power supply node 101 to internal node 103. The amount of current sourced by transistor 102 is determined in part by a bias voltage on node 105, shown as "BIAS1" in FIG. 1. This bias voltage, as well as other bias voltages, are provided by wide-swing bias circuit 300.

All of the transistors shown in FIG. 1, with the exception of transistors 132 and 142, are P-type metal oxide semiconductor field effect transistors (PMOSFETs), also referred to as PMOS transistors. The method and apparatus of the present invention is not limited to the use of PMOS transistors. For example, in some embodiments, N-type (NMOS) transistors are employed, and in others, bipolar junction transistors (BJT) are employed. One skilled in the art will appreciate that a multitude of embodiments exist, each having different types of transistors and combinations of types of transistors. All of these embodiments are within the scope of the present invention.

Transistors 104 and 106 form a differential input pair driven by differential data signals on nodes 116 and 118. In operation, the differential data signals on nodes 116 and 118 are generated by complementary metal oxide semiconductor (CMOS) drivers created from transistors 130, 132, 140, and 142. The differential data signals on nodes 116 and 118 transition substantially between power supply voltages on nodes 101 and 150. This is also referred to as "swinging rail to rail."

As nodes 116 and 118 transition in voltage, transistors 104 and 106 alternately transition between an "off" state and an "on" state. When the transistors are off, they do not conduct current from source to drain, and when on, they do conduct current from source to drain. The current sourced by tail current transistor 102 is, therefore, switched between the two paths provided by the differential input pair as a function of the input data signal.

Transistor 104 has a gate coupled to node 116, a source coupled to internal node 103, and a drain coupled to cascode node 109. Likewise, transistor 106 has a gate coupled to node 118, a source coupled to internal node 103, and a drain coupled to cascode node 111. As discussed above, because of the switching action of the input differential pair, only one of cascode nodes 109 and 111 has a steady-state current flowing thereon at a time. For example, when the voltage on node 116 is high and the voltage on 118 is low, the current from tail current transistor 102 flows through input transistor 106 and on node 111, and input transistor 104 is off and no current flows on node 109. Also for example, when the voltage on node 116 is low and the voltage on node 118 is high, the current from tail current transistor 102 flows through input transistor 104 and on node 109, and input transistor 106 is off and no current flows on node 111.

Current mode driver 100 also includes pre-charge transistors 108 and 110. Pre-charge transistors 108 and 110 charge cascode nodes 109 and 111, respectively, when no current flows on the respective cascode node. For example, when input transistor 104 is off and no current flows on node 109, pre-charge transistor 108 is on and cascode node 109 charges to a voltage value of "BIAS3." Also for example, when input transistor 106 is off, pre-charge transistor 110 is on and cascode node 111 is charged to "BIAS3." Pre-charge transistors 108 and 110 are examples of precharge circuits that pre-charge the cascode nodes when no current flows thereon. In some embodiments, other pre-charge circuits are used to charge the cascode nodes.

Current drive 100 also includes cascode output transistors 112 and 114. Cascode output transistor 112 is coupled from source to drain between cascode node 109 and output node 166. Likewise, cascode transistor 114 is coupled from source to drain between cascode node 111 and output node 164. Casecode output transistors 112 and 114 are biased in saturation by a bias voltage "BIAS2" provided on node 115 by wide-swing bias circuit 300.

The effective output capacitance of current driver 100 is small in part because cascode output transistors 112 and 114 operate in saturation, which provides a high impedance path to all of the parasitic capacitances at the internal nodes of current driver 100. Current driver 100 also has a high output impedance achieved by the cascode connections.

Because input transistors 104 and 106 have rail to rail input swings, they can be sized much smaller than cascode output transistors 112 and 114. As a result, the gate capacitance on nodes 116 and 118 can be kept relatively small, thereby reducing the dynamic power consumption of the CMOS drivers.

Figure 2:
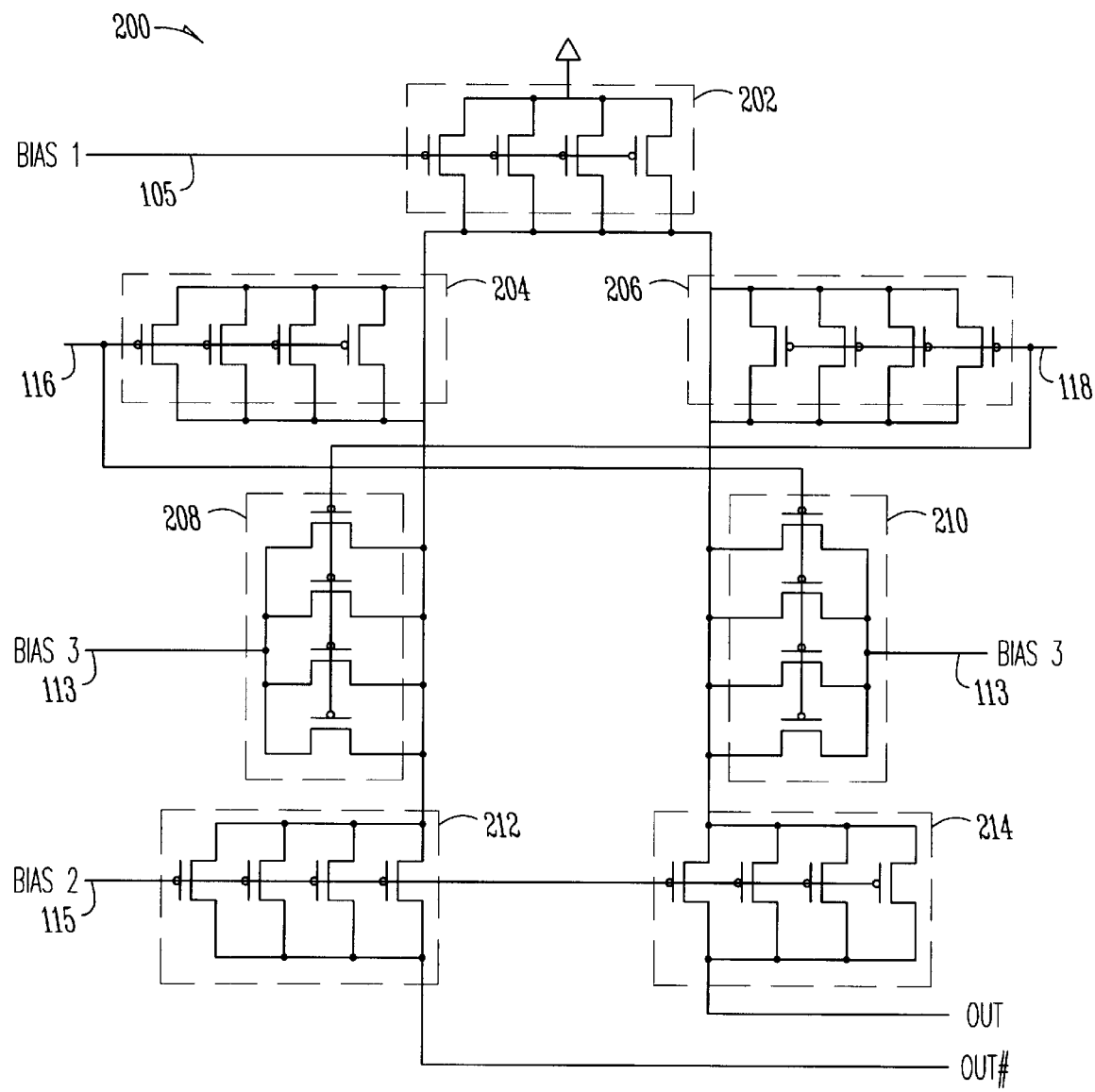
FIG. 2 shows a differential cascode current mode driver.

FIG. 2 shows a differential cascode current mode driver. Current driver 200 includes transistor groups 202, 204, 206, 208, 210, 212, and 214. Transistor group 202 includes tail current devices biased at BIAS1 on node 105. Transistor groups 204 and 206 form an input differential pair, and groups 208 and 210 form pre-charge circuits. Transistor groups 212 and 214 form cascode output transistors. In general, for every transistor in current mode driver 100 (FIG. 1), current mode driver 200 includes a group of transistors coupled in parallel. As a result, current mode driver 200 has increased current drive on the output. In the embodiment shown in FIG. 2, current mode driver 200 has four parallel transistors for every transistor in current mode driver 100, and has four times the output current drive. In other embodiments, more than four transistors are employed, and the current drive is more than four times the current drive of current mode driver 100. In still other embodiments, less than four transistors are employed, and the current drive is less than four times the current drive of current mode driver 100.

In embodiments represented by FIG. 2, transistor groups 208 and 210 each include four parallel transistors to form pre-charge circuits. In these embodiments, internal capacitance values provided by the precharge circuits are scaled the same as the current drive. In other embodiments, groups 208 and 210 include a different number of transistors than the remaining groups. For example, in some embodiments, groups 202, 204, 206, 212, and 214 have four transistors as shown in FIG. 2, but groups 208 and 210 each have a single transistor as shown in FIG. 1. In embodiments with a single pre-charge transistor, the capacitance on the cascode nodes is reduced without compromising the increased current drive.

Figure 3:
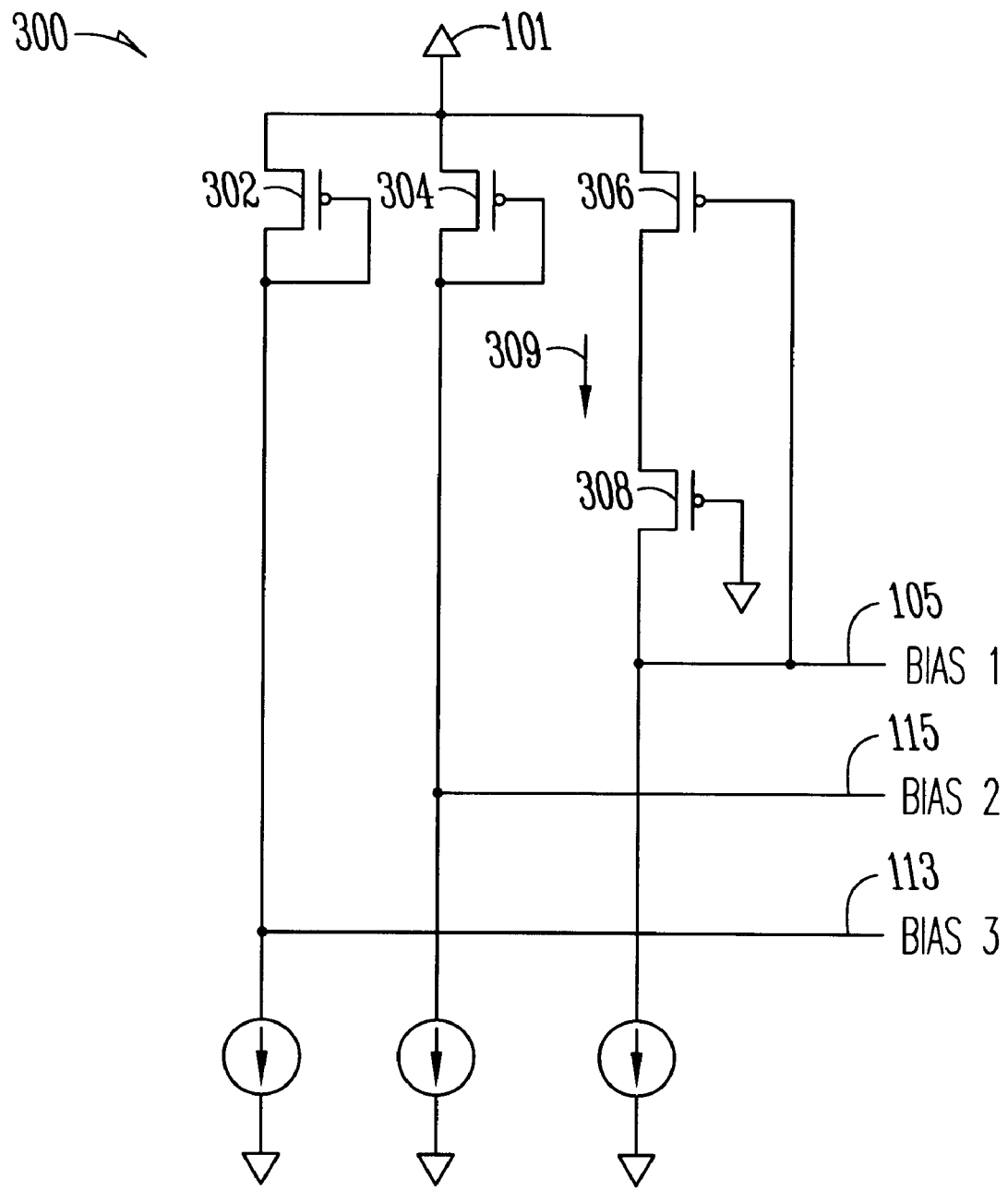
FIG. 3 shows a wide-swing bias circuit.

FIG. 3 shows a wide-swing bias circuit. Wide-swing bias circuit 300 includes transistors 302, 304, 306, and 308. Transistors 302 and 304 are diode-connected. The term "diode-connected," as used herein, refers to a transistor that has a gate and a drain coupled together, as do transistors 302 and 304. Each of transistors 302 and 304 are in series with a current source, and a bias voltage is generated as the voltage drops from the voltage on power supply node 101 across the diode connected transistor. The voltage drop across transistor 302 is used to generate BIAS3 on node 113, and the voltage drop across transistor 304 is used to generate BIAS2 on node 115.

Transistor 306 is diode-connected "around" transistor 308. The term "diode-connected around," as used herein, describes a diode-connected transistor with another transistor coupled source to drain between the diode-connected transistor's drain and gate. The combination of transistors 306 and 308 are in series with a current source, and the bias voltage BIAS1 on node 105 is generated by the voltage drop across transistors 306 and 308.

The gate of transistor 308 has a fixed voltage applied thereto. In embodiments represented by FIG. 3, the gate of transistor 308 is at ground potential. Current 309 in wide-swing bias circuit 300 flows through bias transistor 306 in series with transistor 308 having a gate at ground potential. Likewise, the tail current path in driver 100 includes tail current transistor 102 in series with an input transistor having a gate at ground potential when one of the differential input transistors 104 or 106 is on, because the gate of the input transistor is substantially at ground potential because it is driven by a CMOS driver. This configuration approximately matches the direct current (DC) operating points between driver 100 (FIG. 1) and bias circuit 300 so as to achieve a current match between the bias and the driver.

Figure 4:
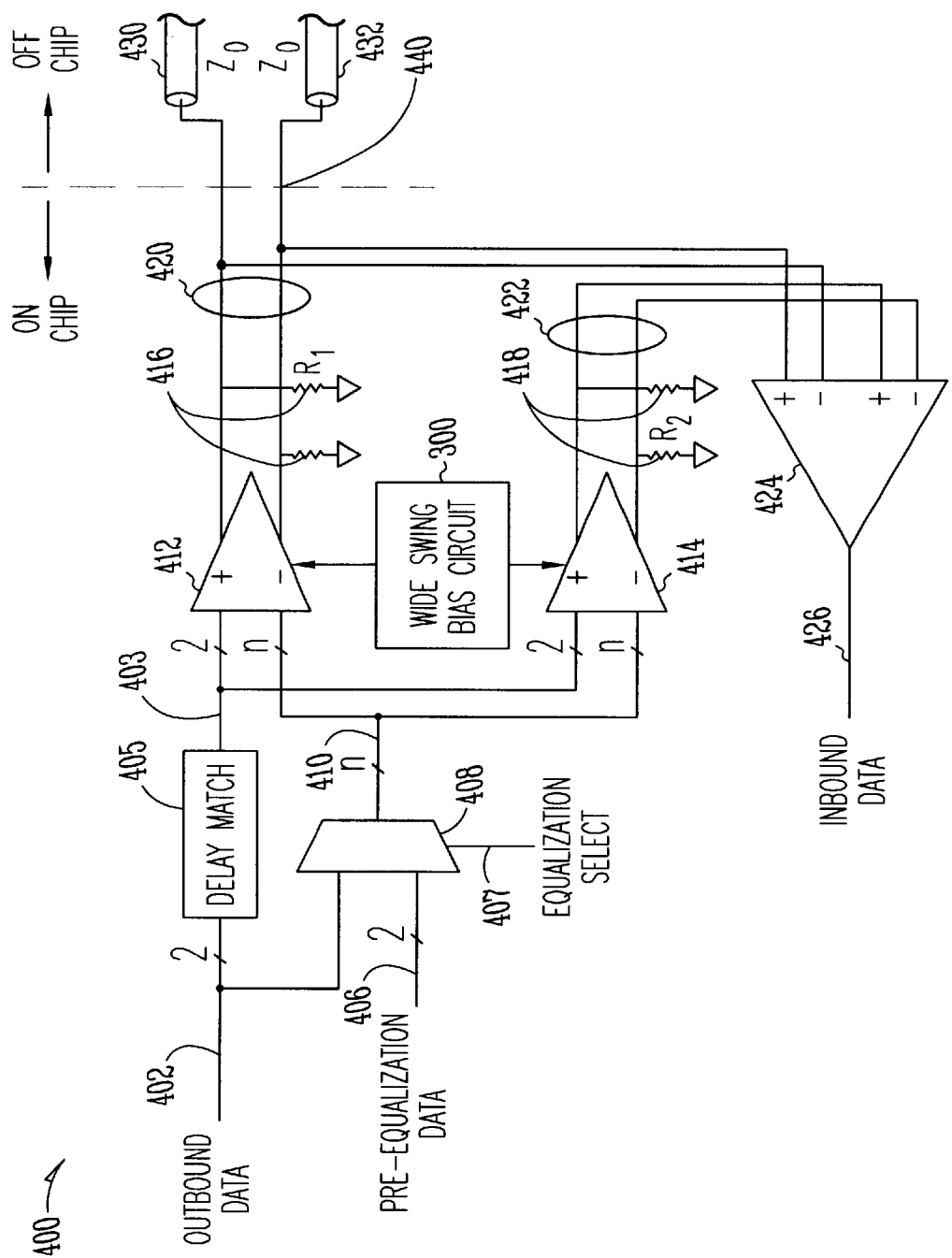
FIG. 4 shows an integrated circuit with a simultaneous bidirectional port circuit.

FIG. 4 shows an integrated circuit with a simultaneous bidirectional port circuit. Integrated circuit 400 is shown with a simultaneous bidirectional port circuit coupled to conductors 430 and 432. In the embodiments represented by FIG. 4, conductors 430 and 432 are transmission lines having a characteristic impedance of $Z_0$. Integrated circuit 400 communicates with other integrated circuits (not shown) bidirectionally and simultaneously using both conductors 430 and 432. In some embodiments, multiple simultaneous bidirectional ports exist within integrated circuit 400, and a bus is formed from multiple pairs of conductors between integrated circuits. The simultaneous bidirectional port circuit within integrated circuit 400, and the operation thereof, are explained below.

Integrated circuit 400 includes multiplexor 408, current mode output driver 412, current mode return driver 414, differential receiver 424, and termination resistors 416 and 418. Outbound data on node 402 is data generated within integrated circuit 400 that is to be transmitted through conductors 430 and 432 to be received by another integrated circuit (not shown). Multiplexor 408 receives outbound data on node 402 and pre-equalization data on node 406. Multiplexor 408 drives a combination of outbound data and pre-equalization data on nodes 410. The amount of pre-equalization data driven on nodes 410 is selected by equalization select data on node 407. Delay match circuit 405 receives outbound data on node 402 and produces a delayed version on node 403. Delay match circuit 405 provides an amount of delay substantially equal to the delay of multiplexor 408.

Current mode output driver 412 receives outbound data on node 403, and a combination of outbound data and pre-equalization data on nodes 410, and drives differential data lines 420. Differential data lines 420 exit integrated circuit 400 at differential data nodes 440, and drive conductors 430 and 432. In some embodiments, differential data nodes 440 are integrated circuit pads coupled to a package that includes integrated circuit 400. Differential data lines 420 also feedback into integrated circuit 400, and drive a differential input node of differential receiver 420. Current mode return driver 414 drives differential data lines 422. Differential data lines 422 do not drive nodes off integrated circuit 400, but do feedback into integrated circuit 400 to drive a second differential input node of differential receiver 420.

Data on nodes 403 and 410 can drive current mode output driver 412 and current mode return driver 414 to one of multiple logical states. Drivers 412 and 414 are current drivers that include a number of smaller current drivers configured in parallel. Example embodiments of drivers 412 and 414 are shown in more detail in FIG. 5. Current mode output driver 412 switches current between differential data lines 420 as a function of the logical state of data on nodes 403 and 410. Likewise, current mode return driver 414 switches current between differential data lines 422 as a function of the same logical states.

As previously described, differential receiver 424 has two sets of differential input nodes, one coupled to differential data lines 420, and the other coupled to differential data lines 422. Differential data lines 420 include data driven by both integrated circuit 400 and any other integrated circuits coupled to conductors 430 and 432. In contrast, data lines 422 only include data driven by integrated circuit 400. Differential receiver 424 subtracts the differential voltage on differential data lines 422 from a differential voltage on differential data lines 420 to produce inbound data on node 426. Inbound data on node 426 represents the outbound data sent from a different integrated circuit coupled to integrated circuit 400 across the simultaneous bidirectional interface.

In some embodiments, multiplexor 408 provides drivers 412 and 414 with both outbound data and pre-equalization data. In these embodiments, nodes 410 include multiple physical nodes. For example, in some embodiments, multiplexor 408 drives a replica of the outbound data as well as pre-equalization data on multiple physical nodes to drivers 124 and 126. Pre-equalization data is utilized within driver 412 to adjust the amplitude of the output current drive on bidirectional data lines 420 to compensate for channel variations in conductors 430 and 432. For example, if high frequency signals are attenuated in conductors 430 and 432, current mode output driver 412 can utilize pre-equalization data to drive a higher amplitude when outbound data changes at a higher frequency.

In some embodiments, the simultaneous bidirectional port circuit within integrated circuit 400 performs variable equalization. In these embodiments, equalization select data on node 407 sets the amount of equalization provided by multiplexor 408. Multiplexor 408 can provide all outbound data, all pre-equalization data, or a mix of the two.

As previously described, drivers 412 and 414 are current mode drivers that switch currents between output nodes as a function of the logical state of the input nodes. Current mode output driver 412 drives a differential current on differential data lines 420. This differential current is terminated by the characteristic impedance ($Z_0$) of conductors 430 and 432, and the resistance ($R_1$) of resistors 416. Therefore, current mode output driver 412 is terminated with an impedance equal to the parallel combination of $Z_0$ and $R_1$. In contrast, current mode return driver 414 drives differential data lines 422 which are terminated only by resistors 418 having a resistance value of $R_2$.

In some embodiments, the resistance values of resistors 416 and 418 are modified in combination with the current drive of drivers 412 and 414 to provide voltage scaling at the input to differential receiver 424. For example, in some embodiments, $R_2$ is a higher resistance value than the parallel combination of $R_1$ and $Z_0$, thereby allowing less current drive to be provided by current mode return driver 414 while maintaining the proper voltage level for comparison at differential receiver 424.

Integrated circuit 400 can be any type of integrated circuits capable of including simultaneous bidirectional port circuits. For example, integrated circuit 400 can be a processor such as a microprocessor, a digital signal processor, a microcontroller, or the like. Integrated circuit 400 can also be an integrated circuit other than a processor such as an application-specific integrated circuit (ASIC), a communications device, a memory controller, or a memory such as a dynamic random access memory (DRAM).

Figure 5:
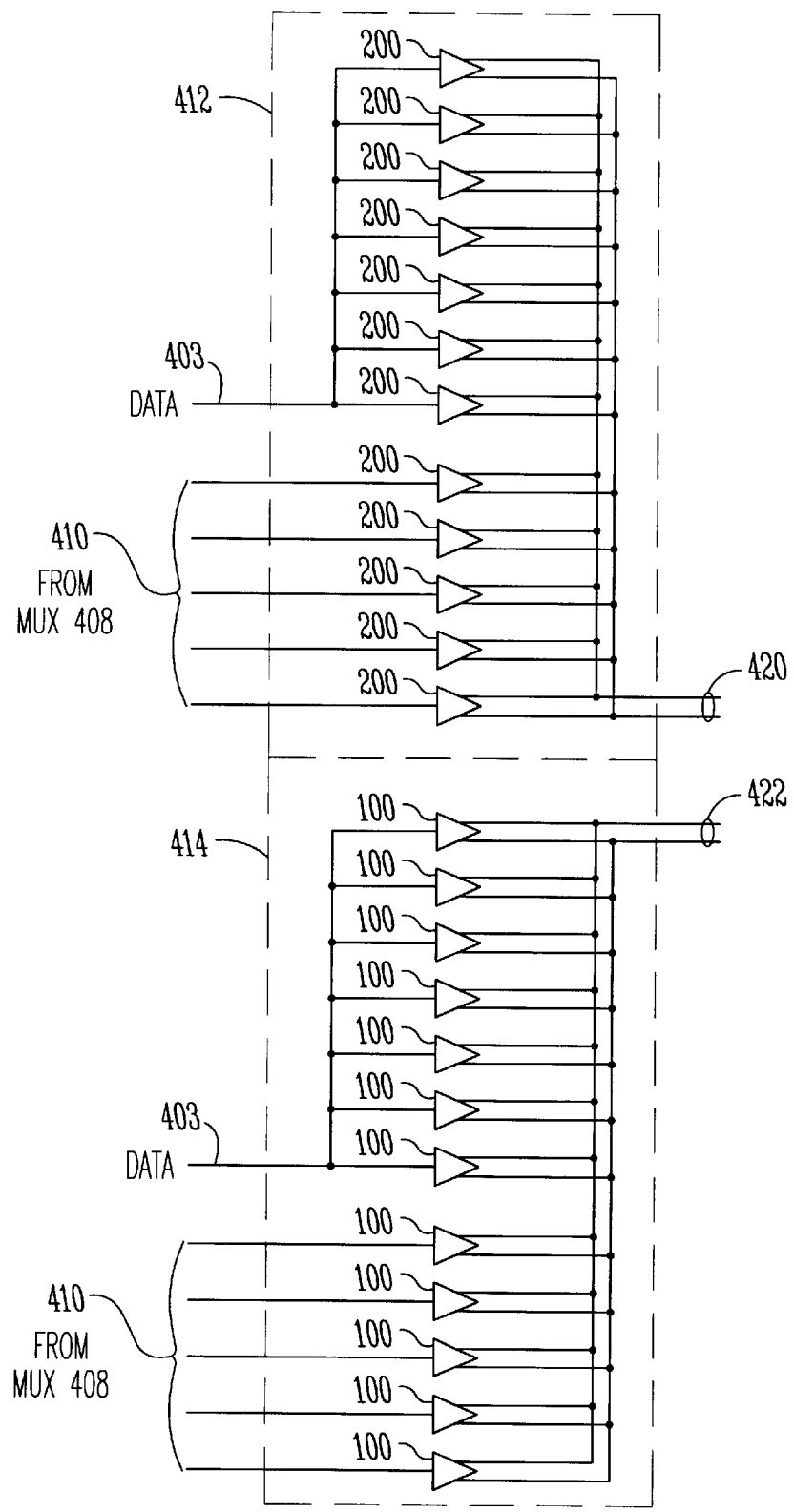
FIG. 5 shows parallel differential cascode current mode drivers.

FIG. 5 shows parallel differential cascode current mode drivers. Current mode output driver 412 includes 12 parallel drivers 200. Drivers 200 are shown in more detail in FIG. 2. Current mode return driver 414 includes 12 parallel drivers 100. Drivers 100 are shown in more detail in FIG. 1. In embodiments represented by FIG. 5, seven of the 12 drivers 200 in current mode output driver 412 are driven by outbound data on node 403, and five of the 12 drivers 200 are driven by data from multiplexor 408 on nodes 410. Likewise, seven of the 12 drivers 100 in current mode output driver 414 are driven by outbound data on node 403, and five of the 12 drivers 100 are driven by data from multiplexor 408 on nodes 410.

In the embodiments of FIG. 5, seven drivers in each of current mode drivers 412 and 414 always drive outbound data on differential data lines 420 and 422. Five drivers in each of current mode drivers 412 and 414, on the other hand, can drive either outbound data or pre-equalization data depending on the state of the equalization select data on node 407 (FIG. 4). Because multiplexor 408 can drive a variable number of drivers with pre-equalization data, variable pre-equalization can be achieved. In the embodiment of FIG. 5, six levels of pre-equalization can be provided by driving between zero and five drivers 100 and 200 with pre-equalization data. The six levels provide 0 dB, 1.5 dB, 3.5 dB, 6 dB, 9.5 dB, and 16 dB of pre-equalization. In general, current mode output drivers 412 and 414 can include any number of drivers 200 and 100, respectively, to provide an range and resolution of pre-equalization.

Each driver 100 has an output current drive capability equal to ¼ the drive of each driver 200. As a result, current mode output driver 412 has a current drive equal to four times that of current mode return driver 414. Accurate current scaling between drivers 412 and 414 can be achieved by varying the number of transistors in the groups of driver 200 (FIG. 2).

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A current mode driver circuit comprising:
   a pair of differential output nodes;
   a cascode output circuit coupled between the pair of differential output nodes and a pair of internal cascode nodes;
   a pair of pre-charge circuits to pre-charge the pair of cascode nodes;
   a differential pair of input transistors coupled to the pair of internal cascode nodes, the differential pair of input transistors having control nodes coupled to a differential pair of input signal nodes, wherein the pair of pre-charge circuits includes transistors having control nodes coupled to the differential pair of input signal nodes;
   a tail current transistor coupled between a power supply node and the differential pair of input transistors; and
   a bias circuit to bias the tail current transistor, the bias circuit including a first transistor with a gate at a fixed potential, and a second transistor diode connected around the first transistor.

2. The current mode driver circuit of claim 1 wherein each of the pair of pre-charge circuits includes a transistor to pre-charge the corresponding internal cascode node when current is not flowing.

3. The current mode driver of claim 1 further comprising CMOS drivers coupled to the control nodes of the differential pair of input transistors.

4. The current mode driver of claim 1 wherein the cascode output circuit includes a plurality of cascode transistors in parallel between an internal cascode node and an output node.

5. The current mode driver of claim 4 further comprising a first plurality of parallel connected transistors coupled in parallel with a first of the differential pair of input transistors, and a second plurality of parallel connected transistors coupled in parallel with a second of the differential pair of input transistors.

6. An integrated circuit comprising:
   a differential receiver having first and second differential input node pairs;
   a first current mode driver having an input node coupled to an outbound data node, and a differential output node pair coupled to the first differential input node pair of the differential receiver; and
   a second current mode driver having an input node coupled to the outbound data node, a differential output node pair coupled to the second differential input node pair of the differential receiver, cascode output transistors coupled between the differential output node and a pair of cascode nodes, a pair of pre-charge circuits to pre-charge the pair of cascode nodes, a pair of differential input transistors coupled between the outbound data node and the pair of cascode nodes, and a tail current device coupled between an upper voltage supply node and the pair of differential input transistors;
   wherein the first current mode driver includes a plurality of parallel connected transistors for every transistor in the second current mode driver.

7. The integrated circuit of claim 6 wherein the integrated circuit includes at least one integrated circuit pad, and the first current mode driver differential output node pair is coupled to the at least one integrated circuit pad.

8. The integrated circuit of claim 6 further including CMOS drivers coupled to the outbound data node to drive data to both the first and second current mode drivers.

9. The integrated circuit of claim 6 further comprising a wide-swing bias circuit to bias the tail current device.

10. The integrated circuit of claim 9 wherein the wide-swing bias circuit comprises:
    a first transistor with a gate coupled to a fixed voltage node; and
    a second transistor diode connected around the first transistor, the second transistor having a gate coupled to the tail current device.

11. A current mode driver comprising:
    a pair of differential input nodes and a pair of differential output nodes;
    a tail current transistor coupled between a voltage supply node and a first node, the tail current transistor having a gate coupled to a first bias node;
    a differential pair of input transistors coupled between the first node and a pair of cascode nodes, the differential pair of input transistors having gates coupled to the pair of differential input nodes;
    a pair of cascode output transistors coupled between the pair of cascode nodes and the pair of differential output nodes, the pair of cascode output transistors having gates coupled to a second bias node;
    a pair of pre-charge circuits to pre-charge the pair of cascode nodes to a voltage on a third bias node; and
    a wide-swing bias circuit to produce bias voltages on the first, second, and third bias nodes, wherein the wide-swing bias circuit comprises a first transistor having a gate coupled to a fixed voltage, and a second transistor diode-connected around the first transistor, the second transistor having a gate coupled to the first bias node.

12. The current mode driver of claim 11 wherein the pre-charge circuits each comprise a transistor having a source and drain coupled between a corresponding cascode node and the third bias node, and having a gate coupled to one of the differential pair of input nodes.

13. The current mode driver of claim 12 further comprising a pair of CMOS drivers to drive the differential pair of input nodes.

14. An integrated circuit comprising:
    a differential receiver having first and second differential input node pairs;
    a first current mode driver having an input node coupled to an outbound data node, and a differential output node pair coupled to the first differential input node pair of the differential receiver; and
    a second current mode driver having an input node coupled to the outbound data node, a differential output node pair coupled to the second differential input node pair of the differential receiver, cascode output transistors coupled between the differential output node and a pair of cascode nodes, a pair of pre-charge circuits to pre-charge the pair of cascode nodes, a pair of differential input transistors coupled between the outbound data node and the pair of cascode nodes, and a tail current device coupled between an upper voltage supply node and the pair of differential input transistors.

15. The integrated circuit of claim 14 wherein the integrated circuit includes at least one integrated circuit pad, and the first current mode driver differential output node pair is coupled to the at least one integrated circuit pad.

16. The integrated circuit of claim 14 further including CMOS drivers coupled to the outbound data node to drive data to both the first and second current mode drivers.

17. The integrated circuit of claim 14 further comprising a wide-swing bias circuit to bias the tail current device.

18. The integrated circuit of claim 17 wherein the wide-swing bias circuit comprises:
  a first transistor with a gate coupled to a fixed voltage node; and
  a second transistor diode connected around the first transistor, the second transistor having a gate coupled to the tail current device.

* * * * *